US009052589B2

(12) United States Patent
Kramer et al.

(10) Patent No.: US 9,052,589 B2
(45) Date of Patent: Jun. 9, 2015

(54) POLYMER COMPRISING END GROUPS CONTAINING PHOTOACID GENERATOR, PHOTORESIST COMPRISING THE POLYMER, AND METHOD OF MAKING A DEVICE

(71) Applicant: Dow Global Technologies LLC, Midland, MI (US)

(72) Inventors: John W. Kramer, Midland, MI (US); Daniel J. Arriola, Midland, MI (US)

(73) Assignee: DOW GLOBAL TECHNOLOGIES LLC, Midland, MI (US)

(*) Notice: Subject to any disclaimer, the term of this patent is extended or adjusted under 35 U.S.C. 154(b) by 0 days.

(21) Appl. No.: 14/012,174

(22) Filed: Aug. 28, 2013

(65) Prior Publication Data

US 2014/0065550 A1    Mar. 6, 2014

Related U.S. Application Data

(60) Provisional application No. 61/695,767, filed on Aug. 31, 2012.

(51) Int. Cl.
*G03F 7/004* (2006.01)
*G03F 7/20* (2006.01)
(Continued)

(52) U.S. Cl.
CPC .............. *G03F 7/0041* (2013.01); *G03F 7/20* (2013.01);
(Continued)

(58) Field of Classification Search
CPC ....... G03F 7/0041; G03F 7/0045; G03F 7/46; G03F 7/0397; G03F 7/20; C08F 220/24; C08F 2/38
USPC .............. 430/270.1, 942, 914, 311, 322, 325, 430/329; 526/243
See application file for complete search history.

(56) References Cited

U.S. PATENT DOCUMENTS 6,140,010 A    10/2000 Iwasa et al.
(Continued)

FOREIGN PATENT DOCUMENTS

CN    102070742 A    5/2011
WO    9801478 A1    1/1998
(Continued)

OTHER PUBLICATIONS

Gallatin et al.; "Fundamental Limits to EUV Photoresist"; Advances in Resist Materials and Processing Technology XXIV, edited by Qinghuang Lin; Proc. of SPIE; vol. 6519; 651911-1; (2007), 10 pages.
(Continued)

*Primary Examiner* — Amanda C Walke
(74) *Attorney, Agent, or Firm* — Cantor Colburn LLP

(57) ABSTRACT

A polymer comprises the polymerized product of unsaturated monomers comprising an acid-deprotectable monomer, a base-soluble monomer, a lactone-containing monomer, a photoacid-generating monomer, or a combination comprising at least one of the foregoing monomers, with a chain transfer agent of Formula (I);

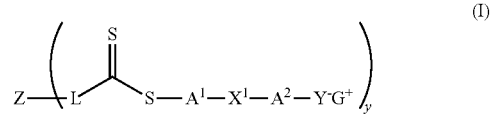

wherein in Formula (I), Z is a y valent $C_{1-20}$ organic group, L is a heteroatom or a single bond, $A^1$ and $A^2$ are each independently ester containing or non-ester containing and are fluorinated or non-fluorinated, and are independently $C_{1-40}$ alkylene, $C_{3-40}$ cycloalkylene, $C_{6-40}$ arylene, or $C_{7-40}$ aralkylene, and $A^1$ contains a nitrile, ester, or aryl substituent group alpha to the point of attachment with sulfur, $X^1$ is a single bond, —O—, —S—, —C(=O)—O—, —O—C(=O)—, —O—C(=O)—O—, —C(=O)—NR—, —NR—C(=O)—, —NR—C(=O)—NR—, —S(=O)$_2$—O—, —O—S(=O)$_2$—O—, —NR—S(=O)$_2$—, or —S(=O)$_2$—NR, wherein R is H, $C_{1-10}$ alkyl, $C_{3-10}$ cycloalkyl or $C_{6-10}$ aryl, $Y^-$ is an anionic group, $G^+$ is a metallic or non-metallic cation, and y is an integer of 1 to 6. A photoresist composition comprising the polymer, a coated substrate, comprising a layer of the photoresist composition, and a method of forming an electronic device from the photoresist, are also disclosed.

11 Claims, 1 Drawing Sheet

$E_0$ (mJ/cm$^2$)

(51) Int. Cl.
  *C08F 2/38* (2006.01)
  *G03F 7/039* (2006.01)
  *C08F 220/28* (2006.01)
  *C08F 220/18* (2006.01)
  *C08F 220/38* (2006.01)

(52) U.S. Cl.
  CPC ............... *C08F 2/38* (2013.01); *G03F 7/0045* (2013.01); *G03F 7/0046* (2013.01); *G03F 7/0397* (2013.01); *C08F 2438/03* (2013.01); *C08F 220/28* (2013.01); *C08F 2220/1891* (2013.01); *C08F 2220/387* (2013.01)

(56) References Cited

U.S. PATENT DOCUMENTS

| | | | |
|---|---|---|---|
| 6,888,020 | B2 | 5/2005 | Kim et al. |
| 7,666,962 | B2 | 2/2010 | Le et al. |
| 7,696,292 | B2 | 4/2010 | Farnham et al. |
| 7,834,113 | B2 | 11/2010 | Sounik et al. |
| 2004/0242798 | A1 | 12/2004 | Sounik et al. |
| 2006/0257781 | A1 | 11/2006 | Benoit et al. |
| 2008/0008965 | A1* | 1/2008 | Ohashi et al. ............ 430/280.1 |
| 2008/0102407 | A1* | 5/2008 | Ohsawa et al. ........... 430/286.1 |
| 2009/0035699 | A1* | 2/2009 | Hasegawa et al. ........ 430/285.1 |
| 2009/0081588 | A1* | 3/2009 | Hatakeyama et al. .... 430/285.1 |
| 2009/0269696 | A1* | 10/2009 | Ohsawa et al. ........... 430/270.1 |
| 2010/0048844 | A1 | 2/2010 | Shih et al. |
| 2010/0055608 | A1* | 3/2010 | Ohashi et al. ............ 430/270.1 |
| 2010/0099042 | A1* | 4/2010 | Ohashi et al. ............ 430/270.1 |
| 2011/0200941 | A1* | 8/2011 | Masunaga et al. ........ 430/285.1 |
| 2012/0077127 | A1 | 3/2012 | Sills et al. |
| 2012/0129103 | A1* | 5/2012 | Ohsawa et al. ........... 430/285.1 |
| 2012/0202141 | A1* | 8/2012 | Inasaki et al. ..................... 430/5 |

FOREIGN PATENT DOCUMENTS

| | | |
|---|---|---|
| WO | 03066685 A2 | 8/2003 |
| WO | 2004056880 A1 | 7/2004 |

OTHER PUBLICATIONS

Kim et al.; "Synthesis of Photoacid Generator-Containing Patternable Diblock Copolymers by Reversible Addition—Fragmentation Transfer Polymerization"; Chem. Mater.; 21; pp. 3030-3032; (2009), 3 pages.

Moad et al., "Advances in RAFT polymerization: the synthesis of polymers with defined end-groups" Polymer 46 (2005) 8458-8468; 11 pages.

Sheehan et al., "RAFT Technology for the Production of Advanced Photoresist Polymers" Advances in Resist Materials and Processing Technology XXV, Proc. of SPIE vol. 6923, 69232E-69232E-9, (2008), 9 pages.

CN 101078879 A with English Abstract; Date of Publication: Nov. 11, 2007; 58 pages.

* cited by examiner

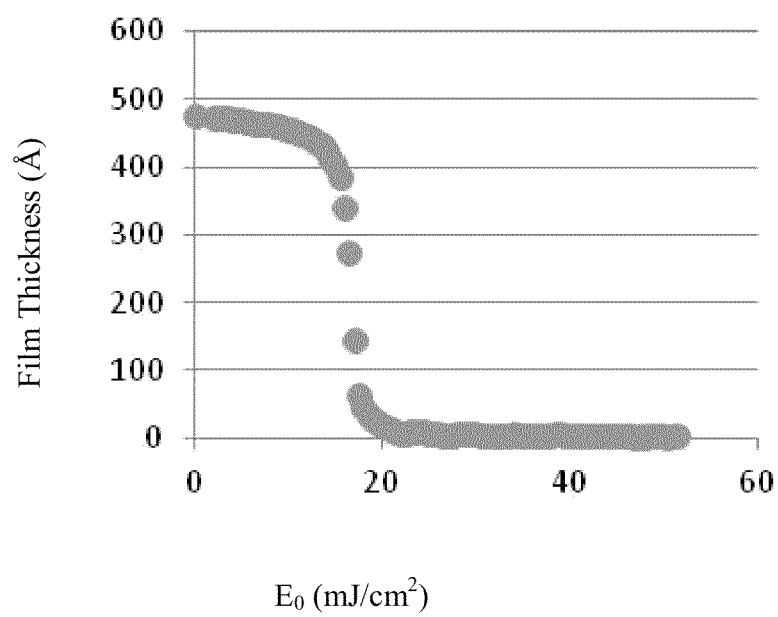

POLYMER COMPRISING END GROUPS CONTAINING PHOTOACID GENERATOR, PHOTORESIST COMPRISING THE POLYMER, AND METHOD OF MAKING A DEVICE

BACKGROUND

Design rules for advanced generation microlithography (i.e., such as e-beam, X-ray, and extreme ultraviolet (EUV) lithography operating at a wavelength of 13.4 nm) are trending toward ever smaller dimensions of, for example, 30 nm and below. The narrower linewidths and thinner resist films used in advanced generation lithography can give rise to consistency issues such as line width roughness (LWR), where resolution takes on increasing significance and limits the performance and usefulness of photoresists. Excessive LWR can lead to poor etch and lack of linewidth control in, for example, transistor and gate architecture, potentially causing short circuits and signal delay in the final devices.

Uneven distribution of photoacid generators (PAGs) for catalyzing deprotection of protected developable groups in photoresist films may contribute to increased LWR and hence poor resolution. PAGs may be incorporated into photoresist formulations by preparing a physical blend of the PAG and a photoresist polymer where, upon spin coating, an inhomogeneous distribution of PAG may occur in the photoresist film, leading to uneven acid generation and greater line edge roughness (LER). Alternatively, the PAG can be attached to the polymer backbone, limiting its mobility in the formulation. While this strategy can improve PAG dispersion in a photoresist film and hence improve pattern formation, the PAGs nonetheless are doubly distributed between both the polymer chains (where some chains may contain more PAG than others) and within a polymer chain (where some chain regions may contain more PAG than others depending on the reactivity ratio of a PAG-containing monomer). More uniform PAG dispersion methods are therefore desirable.

Control of composition, molecular weight, and polydispersity are thus useful for improving PAG dispersion in a photoresist film. Acrylate-based EUV photoresist polymers may be synthesized by modified free radical polymerization techniques in which control of monomer and initiator feed rates help control the composition, but termination and chain transfer reactions can lead to different compositions occurring at different points during a polymerization, and a relatively broad distribution of molecular weights. Because variation in composition affects photoresist solubility, a broad composition distribution across chains and broad molecular weight distributions are not desirable.

Controlled radical polymerization methods can be used to prepare (meth)acrylate containing polymers with polydispersities of less than 2.0. One method of controlled radical polymerization involves use of dithioester chain transfer agents (CTA) to control molecular weight distributions. As described in *Proc. of SPIE*, 2008, Vol. 6923, pp. 69232E-1-69232E-9, reversible addition fragmentation transfer (RAFT) polymerization techniques have been used to produce photoresist polymers for 193 nm lithography. Accurate and specific molecular weights may be obtained based on the amount of CTA, and because the CTAs are chain terminators, it is possible to end-group functionalize polymers made using CTAs.

STATEMENT OF INVENTION

One or more of the above and other deficiencies of the prior art may be overcome by a polymer in accordance with the invention, comprising a polymer, comprising the polymerized product of unsaturated monomers comprising an acid-deprotectable monomer, a base-soluble monomer, a lactone-containing monomer, a photoacid-generating monomer, or a combination comprising at least one of the foregoing monomers, with a chain transfer agent of Formula (I);

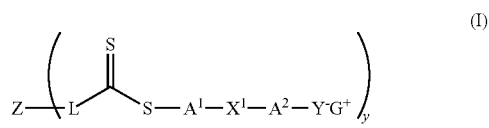

wherein in Formula (I), Z is a y valent $C_{1-20}$ organic group, L is a heteroatom or a single bond, $A^1$ and $A^2$ are each independently ester containing or non-ester containing and are fluorinated or non-fluorinated, and are independently $C_{1-40}$ alkylene, $C_{3-40}$ cycloalkylene, $C_{6-40}$ arylene, or $C_{7-40}$ aralkylene, and $A^1$ contains a nitrile, ester, or aryl substituent group alpha to the point of attachment with sulfur, $X^1$ is a single bond, —O—, —S—, —C(=O)—O—, —O—C(=O)—, —O—C(=O)—O—, —C(=O)—NR—, —NR—C(=O)—, —NR—C(=O)—NR—, —S(=O)$_2$—O—, —O—S(=O)$_2$—O—, —NR—S(=O)$_2$—, or —S(=O)$_2$—NR, wherein R is H, $C_{1-10}$ alkyl, $C_{3-10}$ cycloalkyl or $C_{6-10}$ aryl, $Y^-$ is an anionic group, $G^+$ is a metallic or non-metallic cation, and y is an integer of 1 to 6.

A photoresist composition comprises the polymer.

A coated substrate comprises (a) a substrate having one or more layers to be patterned on a surface thereof; and (b) a layer of the photoresist composition over the one or more layers to be patterned.

A method of forming an electronic device comprises (a) applying a layer of the photoresist composition on a substrate; (b) patternwise exposing the photoresist composition layer to activating radiation; and (c) developing the exposed photoresist composition layer to provide a resist relief image.

BRIEF DESCRIPTION OF THE DRAWINGS

The foregoing and other objects, features, and advantages of the invention are apparent from the following detailed description taken in conjunction with the accompanying drawings in which:

The FIGURE shows a contrast curve of thickness (in Angstroms) versus exposure dose ($E_o$, in millijoules per square centimeter) at 248 nm exposure for an exemplary photoresist prepared using a polymer prepared by RAFT polymerization.

DETAILED DESCRIPTION

Disclosed herein are polymers comprising the polymerization product of a novel compound having a photoacid generator moiety and a radical reactive end for use as chain transfer agents (CTAs) for reversible addition fragmentation transfer (RAFT) controlled polymerization reactions, with an unsaturated monomer. As defined herein, "unsaturated monomer" includes those monomers having a polymerizable double or triple bond, such as, for example, olefins including ethylene, propylene, tetrafluoroethylene, etc., acetylene, propyne, cyclic olefins such as those based on norbornenes, aromatic unsaturated compounds such as styrenes and stilbenes, alpha-beta unsaturated compounds such as (meth) acrylates including their parent acids, crotonates, maleic and fumaric acid derivatives such as maleic anhydride, and the like. Preferred unsaturated monomers compatible with RAFT polymerization processes include styrenes and (meth)acrylates. It should be noted further that as used herein, the term "(meth)acrylates" includes both acrylates and methacrylates.

The CTAs contain, in addition to a sulfur-containing moiety (e.g. dithionate or similar moiety) which upon fragmentation reacts with an available radical, an anionic moiety and corresponding cation. Preferably, the cation is an onium cation, such as an iodonium or a sulfonium cation, capable of photolytically generating an acidic proton when exposed to actinic radiation. Also preferably, the sulfur containing moiety of the compound is attached by a linking group to the anionic moiety. The CTA compounds disclosed herein are useful for preparing narrow polydispersity (PDI<2.0) polymers with photoacid generating end groups. Such polymers can in turn be used to prepare photoresists having well dispersed photoacid generator moieties within a photoresist matrix.

As used herein, "polymer" includes a polymer having two or more different monomeric units, and includes copolymers having two monomeric units, terpolymers having three monomeric units, tetrapolymers having four monomeric units, pentapolymers having five monomeric units, etc. It will also be appreciated that the copolymers disclosed herein may be random copolymers, block copolymers, alternating copolymers, or a combination including two or more of these motifs. The polymer may also have a compositional gradient. Preferably, the copolymers are random copolymers, where no particular order of the monomers is implied by the formulas.

As used herein, an "aryl" is an aromatic group and may be monocyclic, for example, a phenyl group; polycyclic, for example, a biphenyl group; or fused polycyclic, for example, a naphthyl group, and it will be understood that "aryl" includes all aromatic structures including those of fewer than 6 carbon atoms such as hetero aromatic compounds including pyrazoles, thiophenes, oxazoles, pyridines, etc. Also as used herein, an "alkyl" group is an sp$^3$ hybridized carbon containing group and may be linear or branched, and may include cycloalkyl unless otherwise specified. As used herein, "aralkyl" means a group which contains both an aryl moiety and an alkyl moiety, where either the aryl or the alkyl group is the point of attachment to the adjacent radical. Similarly, "arylene", "alkylene", "cycloalkylene", and "aralkylene" groups are divalent aryl, alkyl, cycloalkyl, and aralkyl groups respectively. It should be noted that an aralkylene group has points of attachment at both the aryl and alkyl portions. Furthermore, one or more structural (as opposed to substituent) atoms of an aryl, arylene, cycloalkyl, cycloalkylene, aralkyl, or aralkylene, may be replaced with one or more heteroatoms, Preferred heteroatoms include oxygen, nitrogen, phosphorus, sulfur, and silicon.

Further, "anion-bound" means that an organic linking group, e.g., an alkyl, aryl, alkoxy, polyalkoxy, ester, carbonate, amide, urea, sulfonate, sulfate, sulfonimide, sulfonamide, acetal or ketal-containing group, or other appropriate group, forms a covalently bonded structure between the anion of the PAG and the sulfur-containing end group of the RAFT moiety. Also as used herein, "substituted" means including a substituent such as a halogen (i.e., F, Cl, Br, I), hydroxy, amino, thiol, carboxyl, carboxylate, amide, nitrile, thiol, sulfide, disulfide, nitro, a $C_{1-10}$ alkyl, a $C_{1-10}$ alkoxy, a $C_{6-10}$ aryl, a $C_{6-10}$ aryloxy, a $C_{7-10}$ alkyl aryl, a $C_{7-10}$ alkyl aryloxy, or a combination comprising at least one of the foregoing. It will be understood that any group or structure disclosed with respect to the formulas herein may be so substituted unless otherwise specified, or where such substitution would significantly adversely affect the desired properties of the resulting structure.

Thus, a polymer includes the polymerized product of an unsaturated monomer and a chain transfer agent, and optionally, an initiator. The chain transfer agent includes a RAFT compound having the Formula (I):

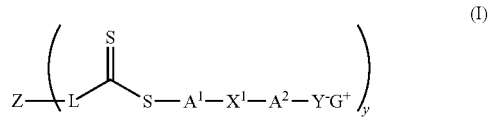

wherein, in Formula (I), Z is a y valent $C_{1-20}$ organic group. Preferably, Z is a $C_{1-20}$ alkyl, $C_{3-20}$ cycloalkyl, $C_{6-20}$ aryl, or $C_{7-20}$ aralkyl group. Exemplary such groups include methyl, ethyl, hexyl, octyl, dodecyl, undecyl, cyclohexyl, neopentyl, phenyl, benzyl, cyclohexylene, phenylene, naphthylene, and xylylene. Preferably, y is an integer of 1 to 6, and preferably, 1 to 4. It will be understood that the value of y does not exceed the available valences for group Z.

Also in Formula (I), $A^1$ and $A^2$ are each independently ester containing or non-ester containing, fluorinated or non-fluorinated groups, and are independently $C_{1-40}$ alkylene, $C_{3-40}$ cycloalkylene, $C_{6-40}$ arylene, or $C_{7-40}$ aralkylene. It will be appreciated that $A^1$ contains a radical stabilizing group including a nitrile, ester, or aryl substituent group alpha to the point of attachment with sulfur, to afford resonance stability of a radical generated adjacent to this point in the molecule. Preferably, $A^1$ is a $C_{1-20}$ alkylene, $C_{3-20}$ cycloalkylene, $C_{6-20}$ arylene, or $C_{7-20}$ aralkylene substituted alpha to the point of attachment with sulfur with a CN, $C_{6-10}$ aryl, or an ester of a $C_{1-10}$ alcohol. Also preferably, $A^2$ is fluorinated or non-fluorinated, and is $C_{1-20}$ alkylene, $C_{3-20}$ cycloalkylene, $C_{6-20}$ arylene, or $C_{7-20}$ aralkylene.

As used throughout this specification, "fluoro" or "fluorinated" means that one or more fluorine groups are attached to the associated group. For example, by this definition and unless otherwise specified, "fluoroalkyl" encompasses monofluoroalkyl, difluoroalkyl, etc., as well as perfluoroalkyl in which substantially all carbon atoms of the alkyl group are substituted with fluorine atoms; similarly, "fluoroaryl" means monofluoroaryl, perfluoroaryl, etc. "Substantially all" in this context means greater than or equal to 90%, preferably greater than or equal to 95%, and still more specifically greater than or equal to 98% of all atoms attached to carbon are fluorine atoms.

Also in Formula (I), L is a heteroatom or a single bond. Heteroatom, as used herein and unless otherwise specified, includes a divalent or polyvalent heteroatom such as O, N, P, S, Si, where for heteroatoms such as, for example, N, P, and Si, the unfilled valences are substituted with R (e.g., NR, PR, PR$_3$, SR$_2$, SiR$_2$, etc.), where R is H, $C_{1-10}$ alkyl, $C_{3-10}$ cycloalkyl, $C_{6-10}$ aryl, or $C_{7-10}$ aralkyl. Preferably, $X^1$ is a —C(=O)—O— or —O—C(=O)—.

Linking group $X^1$ in Formula (I) includes a single bond, —O—, —S—, —C(=O)—O—, —O—C(=O)—, —O—C(=O)—O—, —C(=O)—NR—, —NR—C(=O)—, —NR—C(=O)—NR—, —S(=O)$_2$—O—, —O—S(=O)$_2$—O—, —NR—S(=O)$_2$—, or —S(=O)$_2$—NR, wherein R is H, $C_{1-10}$ alkyl, $C_{3-10}$ cycloalkyl or $C_{6-10}$ aryl. Preferably, $X^1$ is a single bond, —O—, —C(=O)—O—, —O—C(=O)—, —O—C(=O)—O—, or —S(=O)$_2$—O—.

$Y^-$ in Formula (I) is an anionic group and includes sulfonate, sulfate, sulfonamide anion, or sulfonimide anion group. Preferably, $Y^-$ is an anionic group including a sulfonate (–SO$_3^-$), the anion of a sulfonamide (–SO$_2$(N$^-$)R' where R' is a $C_{1-10}$ alkyl or $C_{6-20}$ aryl, or the anion of a sulfonimide. Where $Y^-$ is a sulfonimide anion, the sulfonimide may be an asymmetric sulfonimide having the general structure —$SO_2$—(N)—$SO_2$—R", where R" is a straight chain or branched $C_{1-10}$ fluoroalkyl group. Preferably, the R" group is a $C_{1-4}$ perfluoroalkyl group, and is derived from the corresponding perfluorinated alkanesulfonic acid, such as trifluoromethanesulfonic acid or perfluorobutanesulfonic acid.

Also in Formula (I), $G^+$ is a metallic or non-metallic cation. Preferably as used herein, $G^+$ is an alkali metal cation, ammonium cation, alkylammonium cation, alkyl-aromatic ammonium cation, sulfonium cation, iodonium cation, phosphonium cation, or a carbonium cation which may be a metal or non-metal cation. Preferred non-metal cations include onium cations, such as those based on sulfonium, oxonium, or iodonium. The onium cations can contain aryl or fluorinated aryl chromophores for enhanced sensitivity to actinic radiation. Preferred cations include sulfonium and iodonium cations.

Preferably, the cation $G^+$ is an onium cation having the Formula (II):

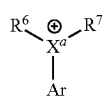

(II)

wherein $X^a$ is I or S, each $R^6$ and $R^7$ is independently a substituted or unsubstituted and is $C_{1-20}$ alkyl, $C_{1-20}$ fluoroalkyl, $C_{3-20}$ cycloalkyl, $C_{3-20}$ fluorocycloalkyl, $C_{2-20}$ alkenyl, $C_{2-20}$ fluoroalkenyl, $C_{6-20}$ aryl, $C_{6-20}$ fluoroaryl, $C_{7-20}$ aralkyl, or $C_{7-20}$ fluoroaralkyl, wherein when $X^a$ is S, $R^6$ and $R^7$ are separate or connected to each other by a single bond, and when $X^a$ is I, one of $R^6$ or $R^7$ is a lone pair of electrons, and Ar is a $C_{5-30}$ aromatic-containing group. Preferably, $R^6$ and $R^7$ are independently $C_{3-20}$ cycloalkyl or $C_{6-20}$ aryl.

Preferred cations $G^+$ have the Formula (II-a) or (II-b):

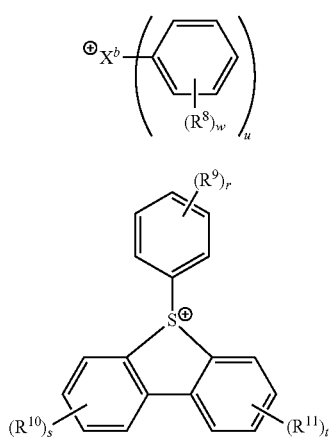

wherein $X^b$ is I or S; $R^8$, $R^9$, $R^{10}$, and $R^{11}$, are each independently hydroxy, nitrile, halogen, $C_{1-10}$ alkyl, $C_{1-10}$ fluoroalkyl, $C_{1-10}$ alkoxy, $C_{1-10}$ fluoroalkoxy, $C_{6-20}$ aryl, $C_{6-20}$ fluoroaryl, $C_{6-20}$ aryloxy, or $C_{6-20}$ fluoroaryloxy; u is an integer of 2 or 3; wherein when $X^b$ is I, u is 2, and when $X^a$ is S, u is 3; r is an integer from 0 to 5; and s and t are each independently an integer from 0 to 4.

Preferred compounds for use as RAFT compounds have the Formula (I-a):

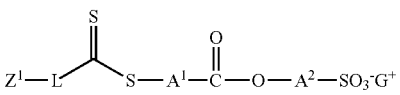

(I-a)

wherein L, $A^1$, $A^2$ and $G^+$ are as defined in formula (I), and $Z^1$ is a substituted or unsubstituted $C_{1-20}$ alkyl, $C_{3-20}$ cycloalkyl, $C_{6-20}$ aryl, or $C_{7-20}$ aralkyl.

Also preferably, the RAFT compound has the Formula (I-b) or (I-c):

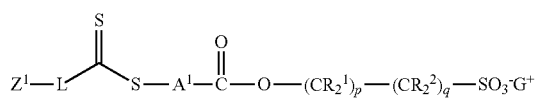

(I-b)

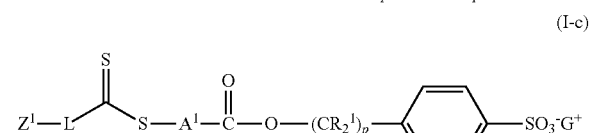

(I-c)

wherein L, $A^1$, and $G^+$ are as defined in formula (I), $Z^1$ is a substituted or unsubstituted $C_{1-10}$ alkyl, $C_{3-10}$ cycloalkyl, $C_{6-10}$ aryl, or $C_{7-10}$ aralkyl, and $R^1$, $R^2$ and $R^3$ are independently H, F, $C_{1-10}$ alkyl, $C_{1-10}$ fluoroalkyl, $C_{3-10}$ cycloalkyl, or $C_{3-10}$ fluorocycloalkyl, p is an integer of from 0 to 10, q is an integer of from 1 to 10, and r is an integer of 0 to 4. Preferably, at least one of $R^2$ and $R^3$ contains fluorine, Useful RAFT compounds include those having the Formula (I-b-1):

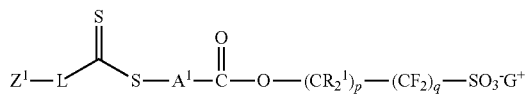

(I-b-1)

wherein L, $A^1$, and $G^+$ are as defined in Formula (I-b), $Z^1$ is a substituted or unsubstituted $C_{1-10}$ alkyl, $C_{3-10}$ cycloalkyl, $C_{6-10}$ aryl, or $C_{7-10}$ aralkyl and $R^1$ is H, F, $C_{1-10}$ alkyl, or $C_{1-10}$ fluoroalkyl, p is an integer of from 1 to 10, and q is an integer of from 1 to 10.

Alternatively, the RAFT compound includes those having the Formula (I-d):

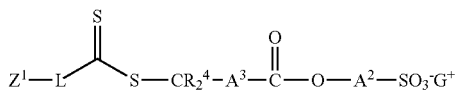

(I-d)

wherein $Z^1$, L, $A^2$ and G are as defined in Formula (I-a), each $R^4$ is independently H, CN, $C_{1-10}$ alkyl, $C_{6-10}$ aryl, or —C(=O)—$OR^5$ where $R^5$ is a $C_{1-10}$ alkyl or $C_{3-10}$ cycloalkyl, provided at least one $R^4$ is not H, and $A^3$ is ester-containing or non-ester containing and is $C_{1-10}$ alkylene, $C_{3-10}$ cycloalkylene, $C_{6-10}$ arylene, or $C_{7-10}$ aralkylene. Preferably, one $R^4$ is CN, $C_6$ aryl, or —C(=O)—$OR^5$ where $R^5$ is a $C_{1-3}$ alkyl and the remaining $R^4$ is H or $C_{1-3}$ alkyl, and $A^3$ is $C_{1-10}$ alkylene, $C_{3-10}$ cycloalkylene, $C_{6-10}$ arylene, or $C_{7-10}$ aralkylene.

Exemplary RAFT compounds include those chosen from the Formulas (I-d-1) to (I-d-6):

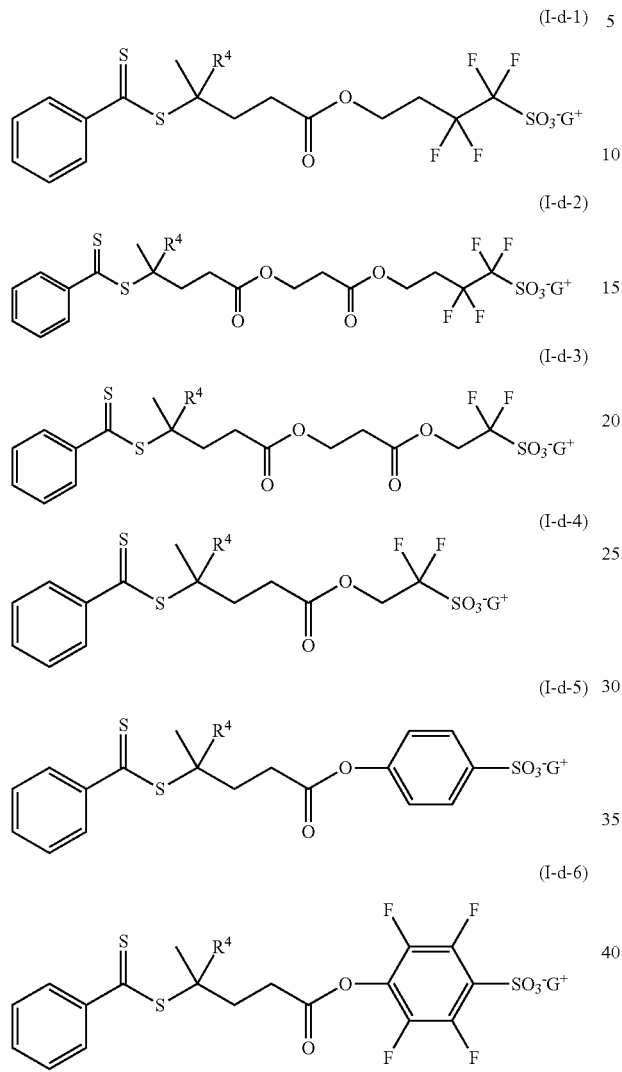

wherein $G^+$ is as defined for Formula (I) and $R^4$ is CN, $C_6$ aryl, or —C(=O)—$OR^5$ where $R^5$ is a $C_{1-3}$ alkyl.

The polymer is the polymerization product of the compound of Formula (I) and an unsaturated monomer. The unsaturated monomer includes an acid-deprotectable monomer having acid labile protecting groups such as tertiary cyclic or acyclic alkyl esters, ketals, acetals, and benzylic esters, masking a base-soluble functional group such as a phenolic group or carboxylic acid group; a base-soluble monomer having base-soluble functional groups such as a phenolic group, carboxylic acid group, or hexafluoroisopropanol group; a lactone-containing monomer; a photoacid-generating monomer, or a combination comprising at least one of the foregoing.

Preferably, the polymer is the polymerized product of, in addition to the RAFT compound of Formula (I), an unsaturated monomer including an acid-deprotectable monomer comprising Formula (III), a base-soluble monomer comprising Formula (IV), a lactone-containing monomer comprising Formula (V), a photoacid-generating monomer comprising Formula (VI), or a combination comprising at least one of the foregoing unsaturated monomers:

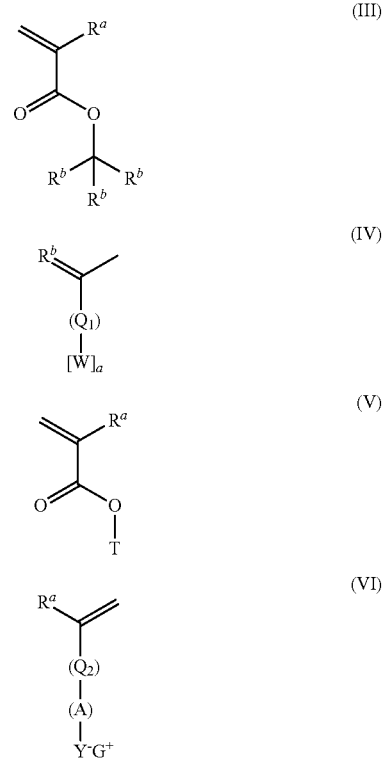

wherein each $R^a$ is independently H, F, CN, $C_{1-10}$ alkyl, or $C_{1-10}$ fluoroalkyl. Preferably, $R^a$ is independently H, $C_{1-4}$ alkyl, or $C_{1-4}$ fluoroalkyl. Exemplary groups $R^a$ include H, —$CH_3$, and —$CF_3$.

In Formula (III), each $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to another $R^b$ to form a cyclic structure. Exemplary acid deprotectable monomers of Formula (III) include:

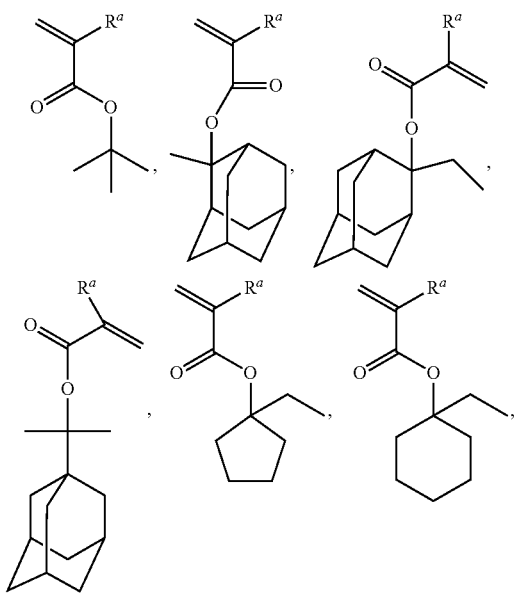

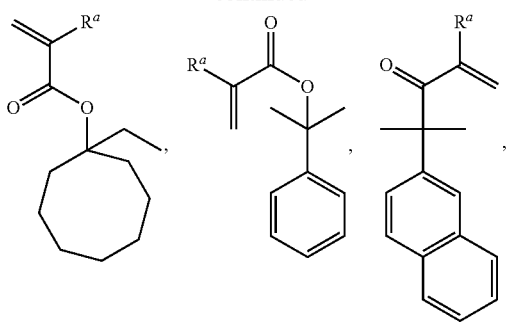

or a combination comprising at least one of the foregoing, wherein $R^a$ is H, F, $C_{1-6}$ alkyl, or $C_{1-6}$ fluoroalkyl.

In Formula (IV), $Q_1$ is an ester-containing or non-ester containing $C_{1-20}$ alkyl, $C_{3-20}$ cycloalkyl, $C_{6-20}$ aryl, or $C_{7-20}$ aralkyl, and W is a base-reactive group comprising —C(=O)—OH; —C(CF$_3$)$_2$OH; —NH—SO$_2$—Y$^1$ where $Y^1$ is F or $C_{1-4}$ perfluoroalkyl; an aromatic —OH; or an adduct of any of the foregoing with a vinyl ether or tertiary alkyloxycarbonyl group such as a t-butyloxy carbonyl. Also in Formula (IV), a is an integer of 1 to 3.

Exemplary base-soluble monomers of Formula (IV) include:

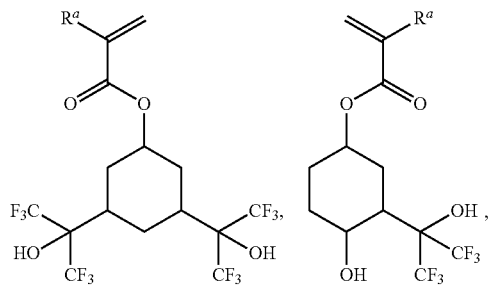

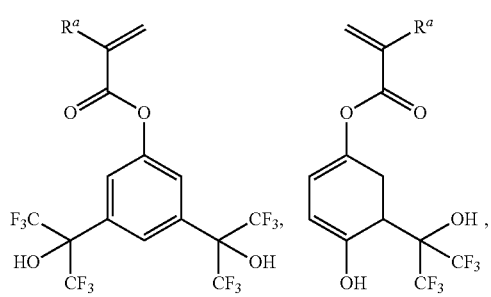

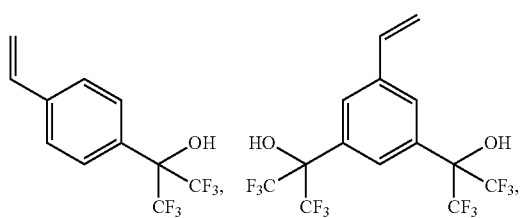

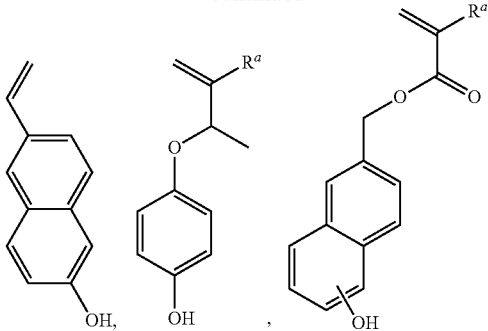

or a combination comprising at least one of the foregoing, wherein $R^a$ is H, F, CN, $C_{1-6}$ alkyl, or $C_{1-6}$ fluoroalkyl.

In the lactone-containing monomer of Formula (V), T is a monocyclic, polycyclic, or fused polycyclic $C_{4-20}$ lactone-containing group.

Exemplary lactone-containing monomers of the Formula (V) include:

or a combination comprising at least one of the foregoing, wherein $R^a$ is H, F, CN, $C_{1-6}$ alkyl, or $C_{1-6}$ fluoroalkyl.

In the optional photoacid generating monomer of Formula (VI), $Q_2$ is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non ester-containing and fluorinated or non-fluorinated, and is $C_{1-20}$ alkyl, $C_{3-20}$ cycloalkyl, $C_{6-20}$ aryl, or $C_{7-20}$ aralkyl, Y$^-$ is an anionic moiety comprising sulfonate, an anion of a sulfonamide, or an anion of a sulfonimide, and G$^+$ is a sulfonium or iodonium cation, and preferably a cation of Formula (II).

Preferably, in Formula (VI), A is a —[(C(R$^c$)$_2$)$_x$C(=O)O]$_c$—(C(R$^d$)$_2$)$_y$(CF$_2$)$_z$— group, or an o-, m- or p-substituted —C$_6$R$^e$$_4$-group, where each R$^c$, R$^d$, and R$^e$ are each independently H, F, CN, $C_{1-6}$ fluoroalkyl, or $C_{1-6}$ alkyl, c is 0 or 1, x is an integer of 1 to 10, y and z are independently integers of from 0 to 10, and the sum of y+z is at least 1.

Exemplary photoacid-generating monomers of Formula (IV) include:

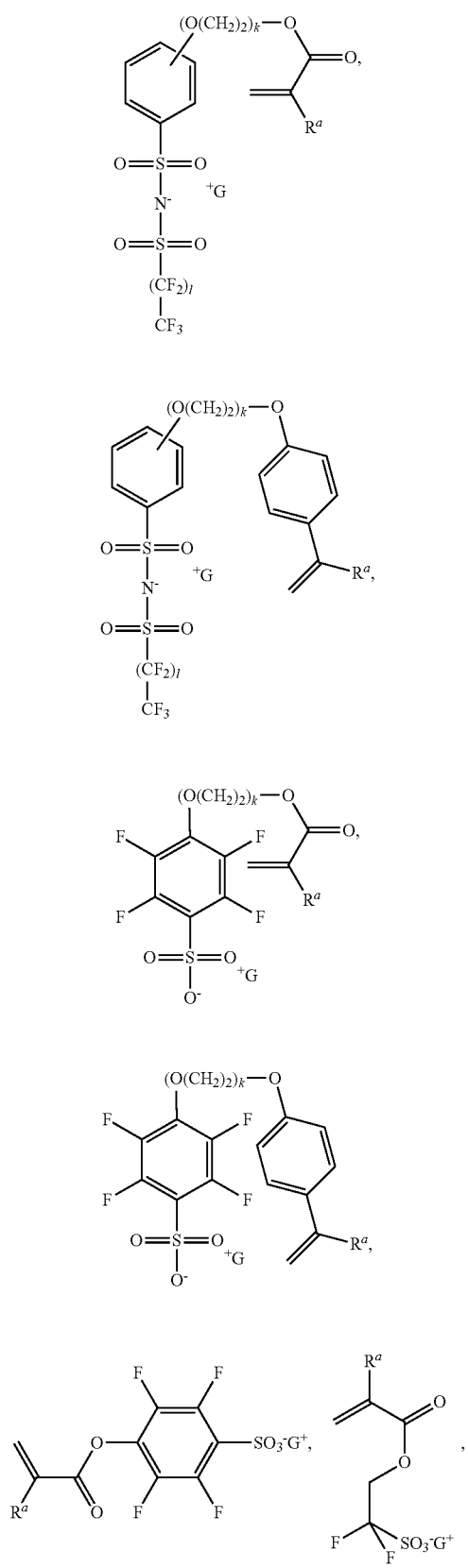

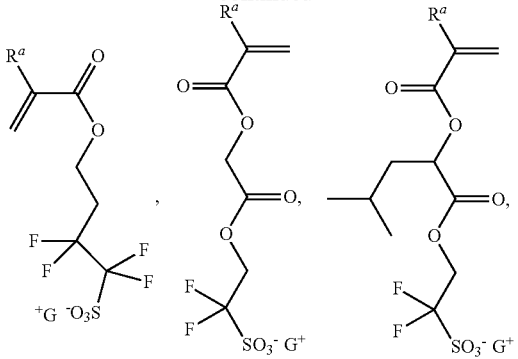

or a combination comprising at least one of the foregoing, where each $R^a$ is independently H, F, $C_{1-6}$ alkyl, or $C_{1-6}$ fluoroalkyl, k is an integer of 0 to 4, 1 is an integer of 0 to 3, and $G^+$ is a cation of Formula (II). Preferably, G is a cation of formulas (III) or (IV).

Specific exemplary photoacid-generating monomers of formula (IV) include those having the formula:

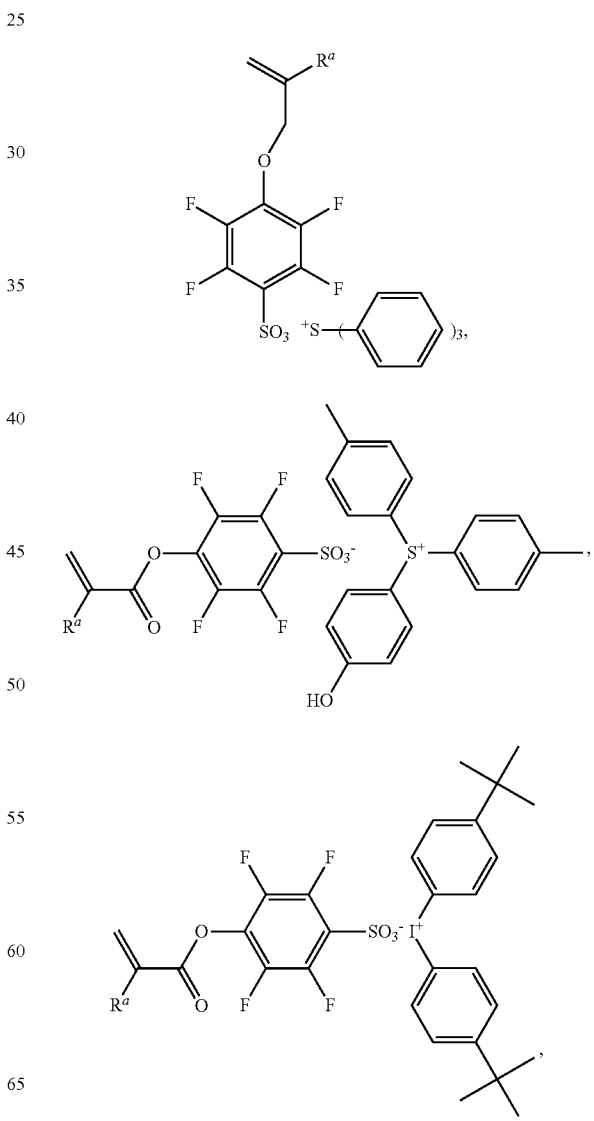

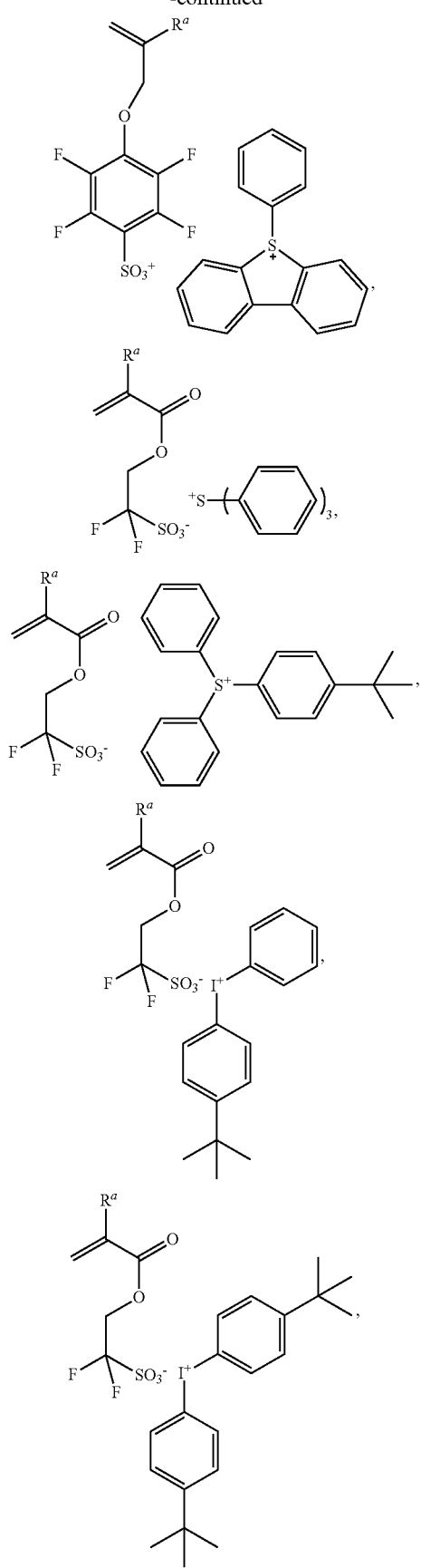
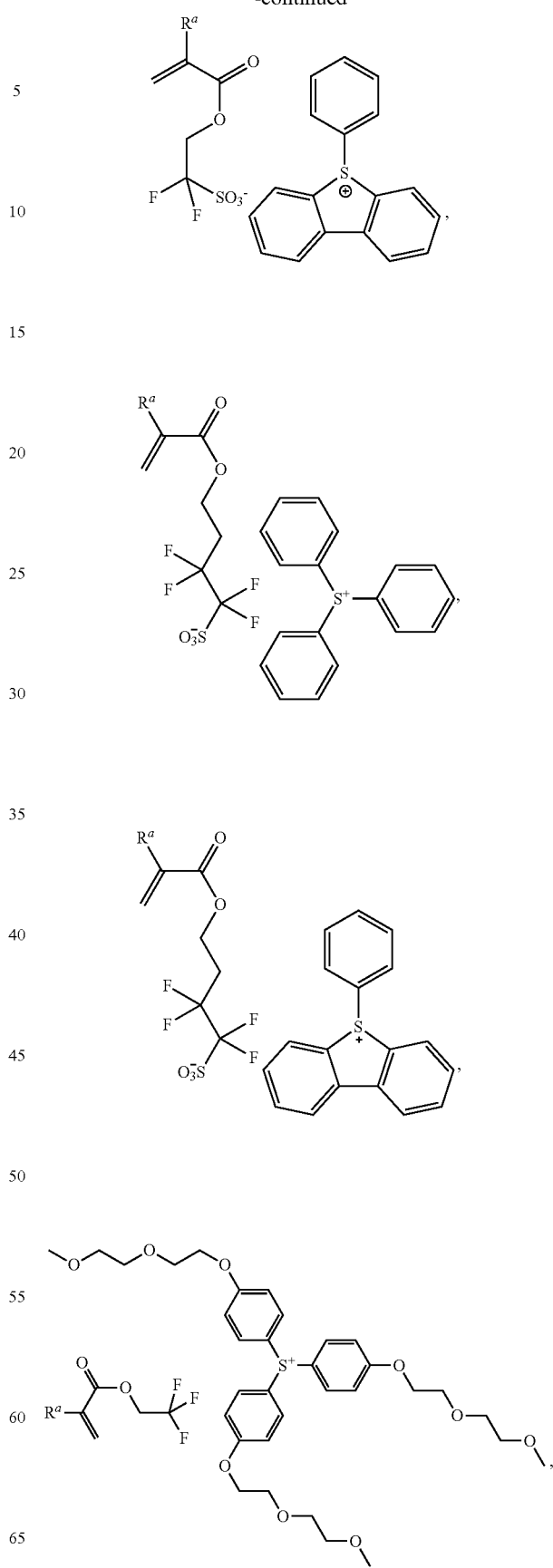

-continued

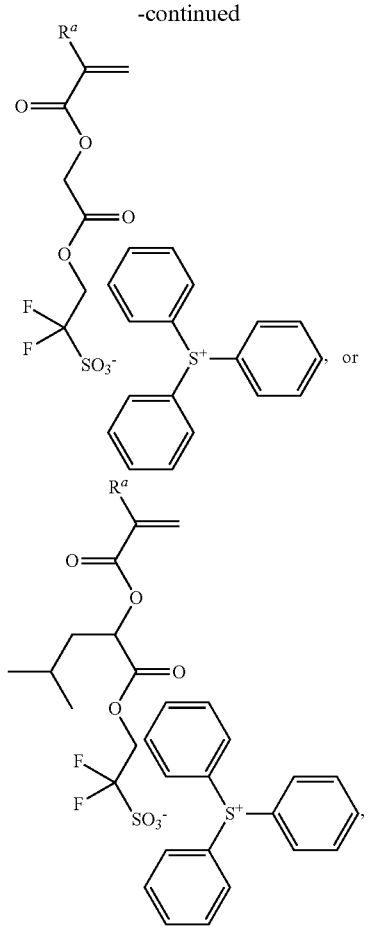

wherein $R^a$ is H, F, CN, $C_{1-6}$ alkyl, or $C_{1-6}$ fluoroalkyl.

A method of making the polymer includes polymerizing one or more of the unsaturated monomers in the presence of a compound of the formula (I); and optionally, an initiator. In addition to the unsaturated monomers described hereinabove, it should be noted that any monomer copolymerizable with these unsaturated monomers under RAFT conditions may be useful in preparing the polymer.

An initiator may be used to initiate the polymerization. Suitable initiators may include any radical initiator useful in the art, such as peroxy initiators, diazo initiators, and the like. For example, peroxy initiators such as tert-butyl hydroperoxide, tert-butyl peroxy 2-ethyl hexanoate (tert-butyl peroctoate), t-butyl peroxy pivalate, tert-butyl peroxy benzoate, di-benzoyl peroxide, tert-butyl peroxy isobutyrate, diazo initiators such as azobis isobutyronitrile (AIBN), 4,4'-azobis(4-cyanovaleric acid); and the like. Preferred initiators include those sold under the tradename VAZO by DuPont, such as VAZO 52, VAZO 67, VAZO 88, and V-601 initiator from Wako. Alternatively, the polymerization may be carried out by thermal initiation (e.g., greater than about 120° C., more preferably greater than about 150° C.). Preferably, thermal initiation may be used where one or more component monomers are styrenic.

The polymer may thus be prepared by radically or thermally initiated polymerization of the monomers in a degassed solvent, in the presence of the chain transfer agent, using the aforementioned reversible addition-fragmentation transfer (RAFT) process. The polymerization may be carried out in batch mode, by batch addition of monomers and/or initiator to the reaction mixture containing the chain transfer addition, by metered addition of separate feeds of one or more of the monomers and/or initiator and/or chain transfer agent to the reaction mixture, or any other suitable method for combining the reactants. It will be appreciated that block copolymers may be produced by sequential addition of monomers for each block to the reaction mixture, or a polymer having a graded composition may be formed by gradually changing the monomer proportions and/or composition in the feed over time. All such polymers preparable by the RAFT method are contemplated herein.

The polymer may have a weight averaged molecular weight (Mw) of 1,000 to 100,000 g/mol, preferably 1,500 to 50,000 g/mol, more preferably 2,000 to 25,000 g/mol, and still more preferably 3,000 to 15,000 g/mol. The polymer may also have a number averaged molecular weight (Mn) of 500 to 100,000 g/mol, preferably 1,000 to 50,000 g/mol, more preferably 1,500 to 25,000 g/mol, and still more preferably 2,000 to 15,000 g/mol. Molecular weights may be determined using any suitable method, such as gel permeation chromatography (GPC) using a crosslinked styrene-divinylbenzene column calibrated to polystyrene standards by universal calibration, at a flow rate of about 1 ml/min. The polymer polydispersity (Mw/Mn; also abbreviated as PDI) is preferably less than 2.0, more preferably less than or equal to 1.8, more preferably less than or equal to 1.6, and more preferably less than or equal to 1.5.

A photoresist composition includes the copolymer having the polymer-bound PAG as described above. The photoresist may also include, in addition to the PAG compound and polymer, additives including for example a photo-destroyable base, and a surfactant. Other additives, such as dissolution rate inhibitors, sensitizers, additional PAGs, etc. may also be included. The photoresist components are dissolved in solvent for dispense and coating.

The photoresist may include a photo-destroyable base. Inclusion of base materials, preferably the carboxylate salts of photo-decomposable cations, provides a mechanism for neutralization of acid from the acid decomposable groups, and limits the diffusion of the photogenerated acid, to thereby provide improved contrast in the photoresist.

Photo-destroyable bases include photo-decomposable cations, and preferably those also useful for preparing PAGs, paired with an anion of a weak (pKa>2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids. Photo-destroyable bases include cation/anion pairs of the following structures, and the cation is triphenylsulfonium or one of the following:

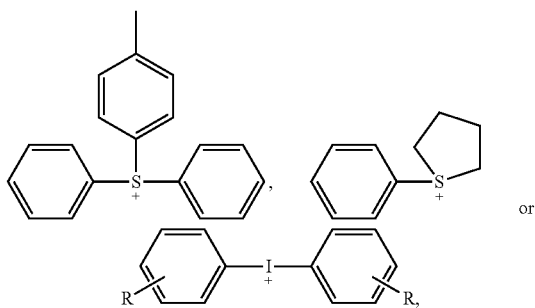

where R is independently H, a $C_{1-20}$ alkyl, a $C_{6-20}$ aryl, or a $C_{6-20}$ alkyl aryl, and the anion is

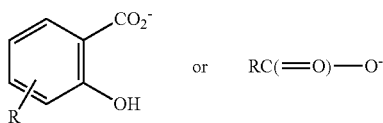 or RC(=O)—O⁻ where R is independently H, a $C_{1-20}$ alkyl, a $C_{1-20}$ alkoxy, a $C_{6-20}$ aryl, or a $C_{6-20}$ alkyl aryl. Other photo-destroyable bases include those based on non-ionic photo-decomposing chromophores such as, for example, 2-nitrobenzyl groups and benzoin groups. An exemplary photobase generator is ortho-nitrobenzyl carbamate.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as Troger's base, a hindered amine such as diazabicycloundecene (DBU) or diazabicyclononene (DBM), or ionic quenchers including quaternary alkyl ammonium salts such as tetrabutylammonium hydroxide (TBAH) or tetrabutyl ammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

The photoresist composition disclosed herein may include the polymer in an amount of 50 to 99 wt %, specifically 55 to 95 wt %, more specifically 60 to 90 wt %, and still more specifically 65 to 90 based on the total weight of solids. It will be understood that "polymer" used in this context of a component in a photoresist may mean only the polymer disclosed herein, or a combination of the polymer with another polymer useful in a photoresist. The photo-destroyable base may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 35 wt %, based on the total weight of solids and solvent. It will be understood that the solids includes copolymer, photo-destroyable base, quencher, surfactant, any added PAG, and any optional additives, exclusive of solvent.

The photoresist including the polymer having PAG end group as disclosed herein may be used to provide a layer comprising the photoresist. A coated substrate may be formed from the photoresist containing the polymer-bound PAG. Such a coated substrate includes: (a) a substrate having one or more layers to be patterned on a surface thereof; and (b) a layer of the photoresist composition including the polymer-bound PAG over the one or more layers to be patterned.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including the polymer having PAG endgroups on a surface of the substrate; (b) pattern-wise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispense, the wafer may be spun at a speed of up to 4,000 rpm, preferably from about 500 to 3,000 rpm, and more preferably 1,000 to 2,500 rpm. The coated wafer is spun to remove solvent, and baked on a hot plate to remove residual solvent and free volume from the film to make it uniformly dense.

Pattern-wise exposure is then carried out using an exposure tool such as a stepper, in which the film is irradiated through a pattern mask and thereby is exposed pattern-wise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid then effects a chemical change in the polymer (deblocking the acid sensitive group to generate a base-soluble group, or alternatively, catalyzing a cross-linking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. A pattern forms by developing.

The photoresist may, when used in one or more such a pattern-forming processes, be used to fabricate electronic and optoelectronic devices such as memory devices, processor chips (CPU's), graphics chips, and other such devices.

The invention is further illustrated by the following examples. All compounds and reagents used below are available commercially except where a procedure is provided. Triphenylsulfonium 1,1-difluoro-2-(methacryloyloxy) ethane-1-sulfonate (the TPS F2 PAG monomer) was obtained commercially from Central Glass.

Structural characterization was carried out by nuclear magnetic resonance (NMR) spectrometry on an NOVA 500 NMR Spectrometer (operating at 500 MHz for $^1$H and 125 MHz for $^{13}$C) or INOVA 400-MR NMR Spectrometer (operating at 400 MHz for $^1$H and 376 MHz for $^{19}$F), each from Varian. Polymer composition was determined by quantitative $^{13}$C NMR at 125 MHz using NOE suppression techniques (i.e., Cr(acetylacetonate)$_3$ and a pulse delay of 2 seconds). Molecular weight (Mw) and polydispersity (PD) were determined by gel permeation chromatography (GPC) using a sample concentration of 1 mg/ml and a crosslinked styrene-divinylbenzene column with universal calibration curve calibrated with polystyrene standards, and eluted with tetrahydrofuran containing 0.2 wt % lithium nitrate at a flow rate of 1 ml/min.

Synthesis of PAG-Functionalized Chain Transfer Agent CTAT1 was carried out according to the following procedure, and as illustrated in Scheme 1 (note that as used herein, "TPS" denotes "triphenylsulfonium").

Scheme 1

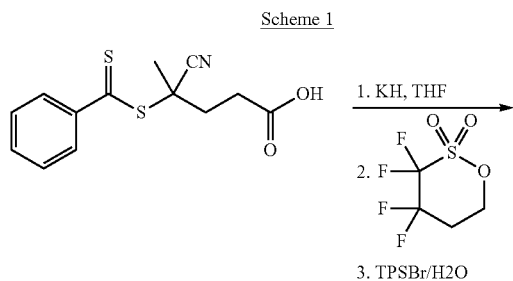

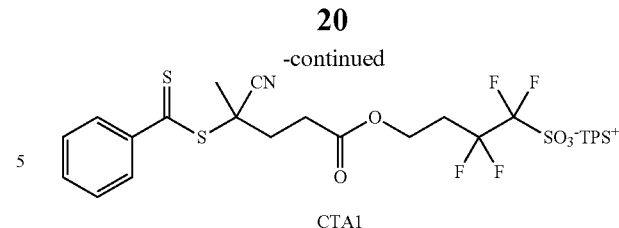

CTA1

4-cyano-4-(thiobenzoylthio)pentanoic acid (0.550 g, 1.97 mmol) was transferred under inert atmosphere to a 20 mL vial and dissolved in 2 g anhydrous THF. To the resulting red solution, KH (0.158 g, 3.94 mmol) was added in small portions over 5 minutes). After the addition, bubbling had stopped and excess KH remained in the darker red colored solution of the anion.

Distilled 3,3,4,4-tetrafluorobutanesultone (0.451 g, 2.17 mmol) was added to a 20 mL vial. Potassium 4-cyano-4-(thiobenzoylthio)pentanoic acid solution was filtered through a frit into the vial containing the sultone, and the mixture stirred at room temperature for 2 h., at which point the solution was removed from the glove box and crude product washed with hexanes (approximately 10 g). A bottom phase of crude product separated as a red oil. The upper light pink hexanes solution was discarded and the red oily crude product redissolved in THF and extracted a second time with hexanes. The resulting twice-extracted oil was used in the next step without further purification.

In the subsequent (metathesis) step, the red oil was dissolved in CH$_2$Cl$_2$ (5 mL) and an aqueous solution of triphenylsulfonium bromide (0.743 g, 2.166 mmol, dissolved in 5 mL of deionized water) was added. The biphasic mixture was shaken vigorously to intermix the phases, and the mixture stirred overnight at room temperature. The aqueous layer was initially pink in color, but over time became colorless. After 18 h., the aqueous layer was removed and the organic phase washed 2× with DI water. The organic phase was then dried over MgSO$_4$ and the solvent removed by rotary evaporation to afford a viscous red oil (1.27 g, 86% yield). The product was analyzed by $^1$H and $^{19}$F NMR spectroscopy. $^1$H NMR (400 MHz, CDCl$_3$): δ 7.91 (d, $^3$J=8.5 Hz, 2H), 7.66-7.78 (m, 15H), 7.55 (t, $^3$J=7.5 Hz, 1H), 7.37 (t, $^3$J=7.4 Hz, 2H), 4.4 (t, $^3$J=6.6 Hz, 2H), 2.40-2.85 (m, 6H), 1.9 (s, 3H). $^{19}$F NMR (CDCl$_3$): −112.3 (m, 2F), −118.3 (m, 2F).

A polymer (Polymer Example 1) was prepared using PAG endgroup compound CTA1 according to the following method and as shown in Scheme 2.

Scheme 2

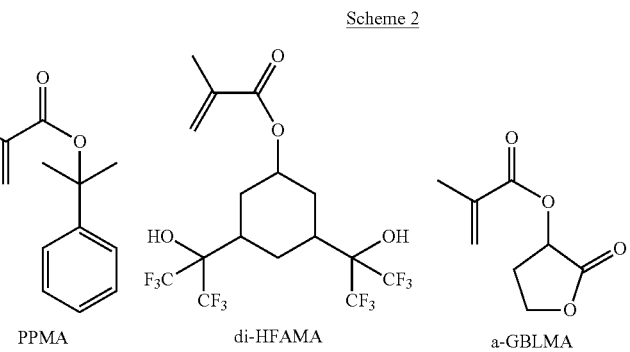

PPMA      di-HFAMA      a-GBLMA

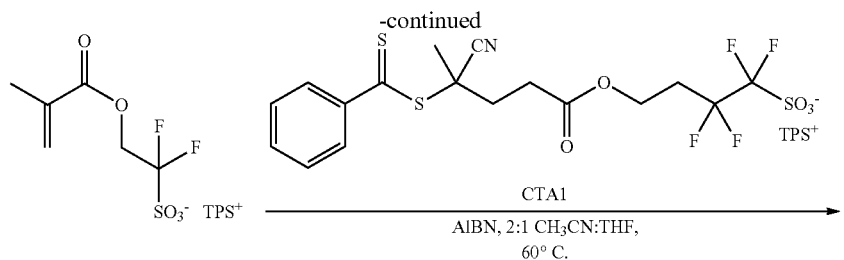

2-phenyl-2-propyl methacrylate (PPMA; 1.50 g, 7.34 mmol), alpha-(gammabutyrolactone)methacrylate (a-GBLMA, 1.82 g, 10.7 mmol), 3,5-bis(1,1,1,3,3,3-hexafluoro-2-hydroxypropan-2-yl)cyclohexyl methacrylate (di-HFAMA, 1.41 g, 2.83 mmol), and triphenylsulfonium 1,1-difluoro-2-(methacryloyloxy)ethane-1-sulfonate (TPS-F2 MA, 0.832 g, 1.69 mmol) were transferred under inert atmosphere into a 20 mL vial to provide a monomer mixture.

8.3 g of a solvent mixture was prepared by combining $CH_3CN$:anhydrous tetrahydrofuran (THF) in a 2:1 (v/v) ratio. About half of the solvent mixture was added to the monomers to dissolve them fully and the resulting monomer solution filtered through a plug of oven-dried neutral alumina directly into a fresh vial, followed by a wash of the plug with the remaining solvent.

A solution of CTA1 (0.991 g, 0.661 mmol, 50 wt % solution in anhydrous THF) was then added to the vial, and dissolved to provide a red, homogeneous solution. 2,2'-azobis (2-methylpropionitrile) (AIBN; 0.660 mL, 0.132 mmol, 0.2 M in toluene) was added and the vial was capped and heated to 60° C. for 72 h. The solution was cooled to room temperature and precipitated into 100 mL 90:10 (v/v) methyl tert-butyl ether/isopropanol (MTBE:iPrOH) twice, where the precipitated polymer was collected by filtration and redissolved in 6 mL THF between precipitations. After the second precipitation, the solid polymer was collected by vacuum filtration and dried in a vacuum oven at 45° C. overnight to yield the polymer as a pink solid. $^{13}C$ NMR (100 MHz, acetone-$d_6$) composition 25:42:12:21 mole % ratio of PPMA/a-GBLMA/di-HFAMA/TPS-F2 PAG, respectively; Mn=6600 g/mol, Mw=7600 g/mol, PDI=1.15.

A second polymer (Polymer Example 2) was prepared without a PAG monomer but with CTA1, according to the following procedure and according to Scheme 3.

Scheme 3

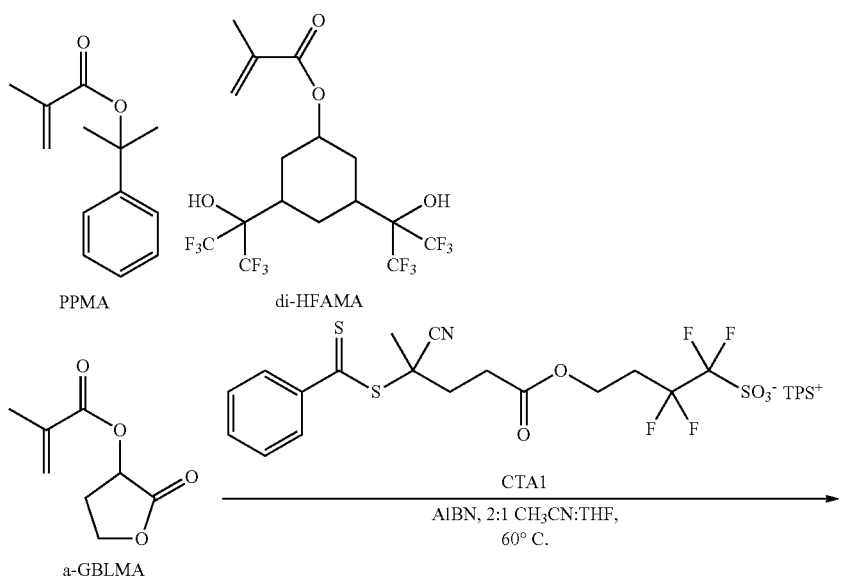

2-phenyl-2-propyl methacrylate (PPMA, 1.50 g, 7.34 mmol), alpha-(gammabutyrolactone)methacrylate (a-GBLMA, 1.87 g, 11.0 mmol), and 3,5-bis(1,1,1,3,3,3-hexafluoro-2-hydroxypropan-2-yl)cyclohexyl methacrylate (di-HFAMA, 1.28 g, 2.56 mmol) were transferred under inert atmosphere to a 20 mL vial. 7.0 g of a solvent mixture was prepared by combining $CH_3CN$:THF in a 2:1 (v/v) ratio. About half the solvent mixture was added to the monomers to dissolve them fully and the monomer solution filtered through a plug of oven-dried neutral alumina directly into a fresh vial, followed by passing the remaining solvent through the alumina.

A solution of CTA1 (0.903 g, 0.602 mmol, 50 wt % solution in anhydrous THF) was transferred to the vial and a red, homogeneous solution formed. A solution of 2,2'-azobis(2-methylpropionitrile) (AIBN; 0.603 mL, 0.121 mmol, 0.2 M in toluene) was added and the vial was capped and heated to 60° C. for 72 h. The solution was cooled to room temperature and precipitated into 100 mL 90:10 (v/v) methyl tert-butyl ether/ isopropanol (MTBE:iPrOH) twice, where the precipitated polymer was collected by filtration and redissolved in 6 mL THF between precipitations. After the second precipitation, the solid polymer was collected by vacuum filtration and dried in a vacuum oven at 45° C. overnight to yield the polymer as a pink solid. $^{13}$C NMR (100 MHz, acetone-$d_6$) composition 25:42:12:21 mole-% ratio of PPMA/a-GBLMA/di-HFAMA, respectively, Mn=7200 g/mol, Mw=8600 g/mol, PDI=1.20.

A second PAG functionalized chain transfer agent (CTA2) having a phenyl dibenzothiophenium (PDBT) cation was prepared according to the following procedure, as illustrated in Scheme 4.

4-cyano-4-(thiobenzoylthio)pentanoic acid (1.00 g, 3.58 mmol) was transferred under inert atmosphere to a 20 mL vial and dissolved in 4 g anhydrous THF. To this red solution, KH (0.287 g, 7.16 mmol) was added in portions over 5 minutes. The red color of the solution darkened during addition of the KH.

Distilled 3,3,4,4-tetrafluorobutanesultone (0.820 g, 3.94 mmol) was added to a second 20 mL vial. The red solution containing the potassium salt of the RAFT compound was filtered through a frit into the vial containing the sultone, and this mixture was stirred at ambient temperature for 2 h. The crude was extracted with hexanes (approximately 10 g). The crude product separated as a red oil. The light pink hexanes solution was discarded and the red oily residue redissolved in THF and extracted a second time with hexanes.

The red oil was then dissolved in $CH_2Cl_2$ (10 mL) and an aqueous solution of phenyldibenzothiophenium bromide (PDBTBr; 1.34 g, 3.94 mmol, dissolved in 30 mL deionized water) was added and the combination shaken vigorously and the mixture stirred at ambient temperature for 12 hours. The aqueous layer was initially pink in color, but became colorless.

The aqueous layer was removed and the organic layer washed with DI water (2×30 mL), dried over $MgSO_4$, and the solvent removed by rotary evaporation to afford PAG functionalized chain transfer agent (CTA2) as a viscous red oil. Yield: 2.24 g (83.7%). The product was analyzed by $^1$H and $^{19}$F NMR spectroscopy. $^1$H NMR (400 MHz, $CDCl_3$): δ 8.16 (dd, $^3$J=8.0 Hz, $^1$J=26 Hz, 4H), 7.80-7.90 (m, 4H), 7.47-7.68 (m, 8H), 7.35-7.40 (m, 2H), 4.41 (t, $^3$J=6.6 Hz, 2H), 2.36-2.87 (m, 6H), 1.91 (s, 3H). $^{19}$F NMR ($CDCl_3$): —112.3 (m, 2F), –118.3 (m, 2F).

A third polymer (Polymer Example 3) containing a PAG-Functionalized CTA with PDBT Cation (CTA2) was prepared according to the following procedure, and as shown in Scheme 5.

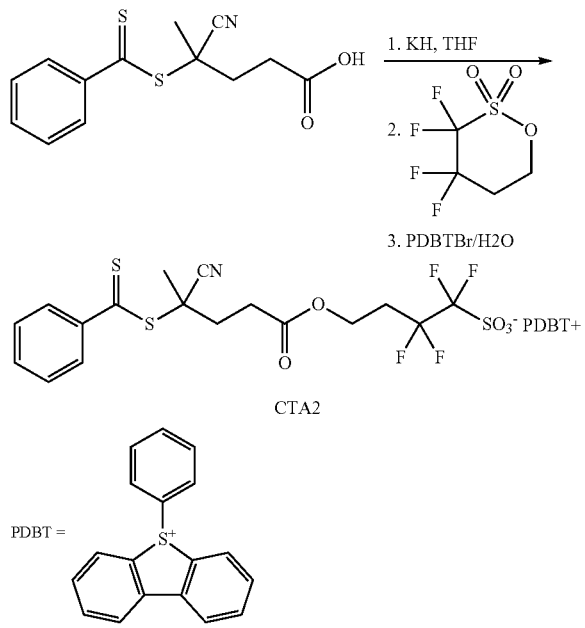

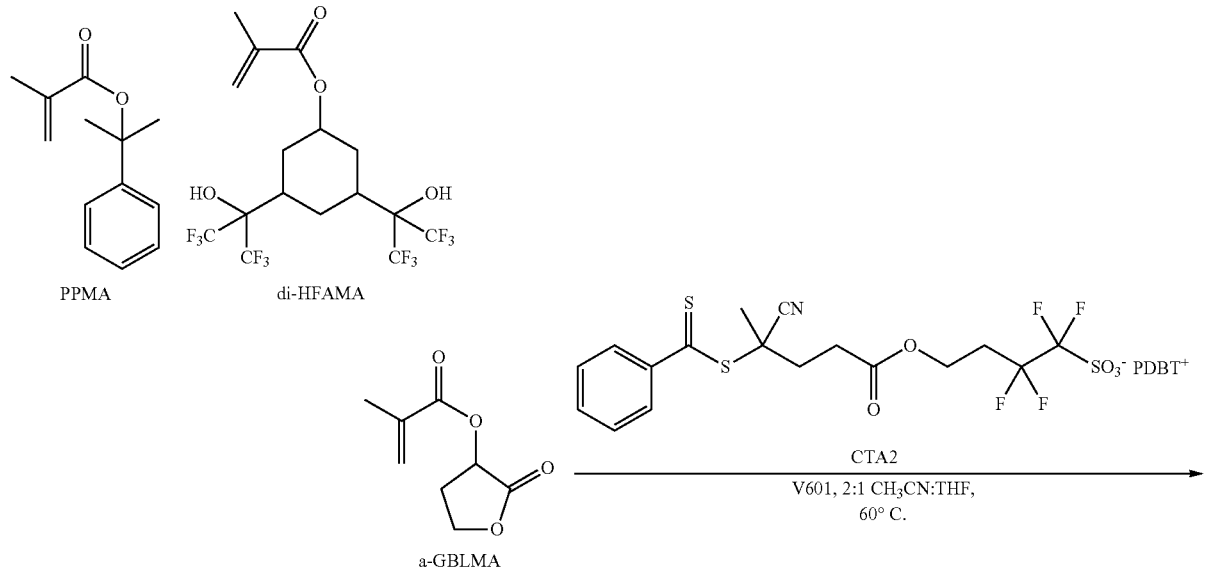

All monomers (PPMA: 2.00 g, 9.79 mmol; di-HFAMA: 1.70 g, 3.41 mmol; a-GBLMA: 2.50 g, 14.7 mmol) were transferred to a 20 mL vial under inert atmosphere. A second 20 mL vial was charged with 9.3 g of a solvent mixture of 2:1 (v/v) $CH_3CN$:THF (sufficient to provide a 40% solids mixture). About half of this solvent mixture was added to the monomers to dissolve them, and the monomer solution filtered through a plug of oven-dried neutral alumina (~2 cm) directly into a fresh vial. The alumina plug was eluted with the remaining solvent mixture and the eluent collected in the vial. A solution of CTA2 (1.32 g, 0.881 mmol, 50 wt % solution in anhydrous THF) was transferred into the monomer-containing vial to produce a red, homogeneous solution. A solution of 2,2'-azobis(methyl 2-methylpropionate) (V601 initiator, available from Wako; 0.0406 mL, 0.176 mmol) was added to the monomer solution and the vial was capped and heated to 60° C. for 26 h. with stirring. Conversion was considered adequate based on crude $^1$H NMR spectroscopy of an aliquot, and the polymer was precipitated into 90 mL diisopropyl ether (i-Pr$_2$O), filtered, and dried overnight at 40° C. under vacuum to yield 5.9 g of polymer. The polymer was analyzed by GPC: Mn=6300 g/mol, Mw=7100 g/mol, PDI=1.12.

Polymer Example 3 was further treated under conditions to remove the dithioester RAFT end group as follows. The polymer (5.9 g, 0.931 mmol), V601 initiator (2.14 g, 9.31 mmol), and lauroyl peroxide (0.742 g, 1.86 mmol) were combined in a 100 mL round bottom flask under inert atmosphere. 15 g of anhydrous $CH_3CN$ was added and heated while stirring to fully dissolve all solids. The flask was heated to reflux at 80° C. for 2.5 h. with vigorous stirring. After that time the color had changed to light orange and the flask was removed from the heat and cooled to RT. The sulfur-free polymer was precipitated into 150 mL i-Pr$_2$O, and an off-while solid was collected by filtration from the light pink solution. The collected polymer was washed with diethyl ether (2×10 mL) to afford a white solid. The solid was dried under $N_2$ and under vacuum at 40° C. to yield 4.5 g of polymer. GPC analysis: Mn=7100 g/mol, Mw=8300 g/mol, PDI=1.18. Relative monomer ratios from $^{13}$C NMR integrations: PPMA: 32%, a-GBLMA: 57%, di-HFA: 11%.

A Formulation Example was prepared to obtain $E_0$ data (in millijoules per square centimeter, mJ/cm$^2$) at 248 nm (DUV) and 13.4 nm (EUV) wavelengths. Positive-tone photoresist compositions were prepared in the following manner. A solution of Polymer Example 3 (2.492 g of a 10 wt % solution in 2-hydroxymethyl isobutyrate) was combined with 0.112 g of a 0.5 wt % solution of diaminocyclohexane diacetate ("DACHDA") in methyl 2-hydroxyisobutyrate, 0.05 g of a 0.5 wt % solution of POLYFOX 656 in methyl 2-hydroxyisobutyrate, and 7.346 g of methyl 2-hydroxyisobutyrate. The sample was filtered through a 0.2 um PTFE filter and spin-coated to 50 nm film thickness on a 200 mm silicon wafer (previously coated with 60 nm of AR9™ Antireflective coating, available from Dow Electronic Materials) and baked at 110° C. for 90 seconds. Contrast curves at 248 nm were obtained using a Canon ES2 scanner with 0.8 NA. The resist was exposed to an increasing dose of 248 nm radiation using an open-frame setting, post exposure baked ("PEB") at 100° C. for 60 seconds and developed with 0.26N aqueous tetramethylammonium hydroxide solution. Thickness was measured at each exposed area and plotted vs. dose to obtain the dose to clear ($E_o$).

Contrast curve measurements utilizing a 13.5 nm light source were obtained using an EUV ES-9000 exposure tool from LithoTech Japan. The resist was exposed to an increasing dose of EUV radiation using an open-frame setting, post exposure baked (PEB) at 100° C. for 60 seconds and developed with 0.26N aqueous tetramethylammonium hydroxide solution. Thickness was measured at each exposed area and plotted vs. dose to obtain the dose to clear (E0).

Unexposed film thickness loss was obtained by measuring the thickness loss of a photoresist film coated on a substrate before and after 60 s contact with 0.26N aqueous tetramethylammonium hydroxide developer solution. Photospeed at 248 nm and EUV wavelengths, along with unexposed film thickness loss (UFTL) in nm are shown in the Table, below.

TABLE

| Formulation Example | Polymer | PAG | $E_0$, DUV (mJ/cm$^2$) | UFTL (nm) | $E_0$, EUV (mJ/cm$^2$) |
|---|---|---|---|---|---|
| FEx | Polymer Example 3 | CTA2 | 16.5 | 1.7 | 1.75 |

In the Table, it can be seen that the formulation (FEx) made with narrow polydispersity Polymer Example 3 prepared using RAFT agent CTA2 has acceptable photospeed $E_0$ at 248 nm exposure and EUV $E_0$. The FIGURE shows the contrast curve obtained at 248 nm (DUV) for FEx.

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A polymer comprising the polymerized product of:
an acid-deprotectable monomer, a base-soluble monomer, a lactone-containing monomer, a photoacid-generating monomer, or a combination thereof; with
a chain transfer agent of formula (I);

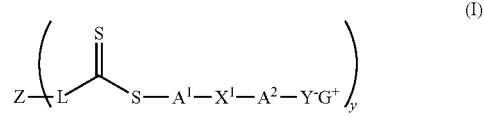

wherein in the formula (I):
Z is a y valent $C_{1-20}$ organic group,
L is a heteroatom or a single bond,
$A^1$ and $A^2$ are each independently ester containing or non-ester containing and are fluorinated or non-fluorinated, and are independently $C_{1-40}$ alkylene, $C_{3-40}$ cycloalkylene, $C_{6-40}$ arylene, or $C_{7-40}$ aralkylene, and $A^1$ contains a nitrile, ester, or aryl substituent group alpha to the point of attachment with sulfur, $X^1$ is a single bond, —O—, —S—, —C(=O)—O—, —O—C(=O)—, —O—C(=O)—O—, —C(=O)—NR—, —NR—C(=O)—, —NR—C(=O)—NR—, —S(=O)$_2$—O—, —O—S(=O)$_2$—O—, —NR—S(=O)$_2$—, or —S(=O)$_2$—NR, wherein R is H, $C_{1-10}$ alkyl, $C_{3-10}$ cycloalkyl or $C_{6-10}$ aryl, $Y^-$ is an anionic group, $G^+$ is a metallic or non-metallic cation, and y is an integer of 1 to 6, and wherein the group

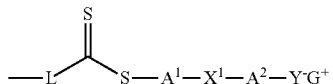

of the chain transfer agent is included in the polymerized product as an end group.

2. The polymer of claim 1, wherein the chain-transfer agent of formula (I) has formula (I-a):

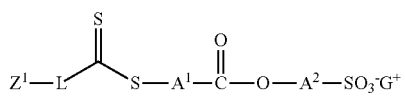

wherein in the formula (I-a), L, $A^1$, $A^2$ and $G^+$ are as defined in formula (I), and $Z^1$ is a substituted or unsubstituted $C_{1-20}$ alkyl, $C_{3-20}$ cycloalkyl, $C_{6-20}$ aryl, or $C_{7-20}$ aralkyl.

3. The polymer of claim 2, wherein the chain-transfer agent of formula (I) has formula (I-b) or (I-c):

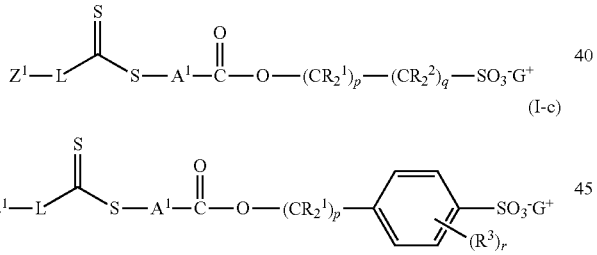

wherein in the formulae (I-b) and (I-c), L, $A^1$, and $G^+$ are as defined in formula (I), $Z^1$ is a substituted or unsubstituted $C_{1-10}$ alkyl, $C_{3-10}$ cycloalkyl, $C_{6-10}$ aryl, or $C_{7-10}$ aralkyl, and $R^1$, $R^2$ and $R^3$ are independently H, F, $C_{1-10}$ alkyl, $C_{1-10}$ fluoroalkyl, $C_{3-10}$ cycloalkyl, or $C_{3-10}$ fluorocycloalkyl, p is an integer of from 0 to 10, q is an integer of from 1 to 10, and r is an integer of 0 to 4.

4. The polymer of claim 1, wherein $G^+$ is a cation of the formula (II):

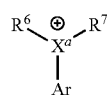

wherein in the formula (II), $X^a$ is I or S, each $R^6$ and $R^7$ is independently substituted or unsubstituted and is a lone pair of electrons, $C_{1-20}$ alkyl, $C_{1-20}$ fluoroalkyl, $C_{3-20}$ cycloalkyl, $C_{3-20}$ fluorocycloalkyl, $C_{2-20}$ alkenyl, $C_{2-20}$ fluoroalkenyl, $C_{6-20}$ aryl, $C_{6-20}$ fluoroaryl, $C_{7-20}$ aralkyl, or $C_{7-20}$ fluoroaralkyl, wherein when $X^a$ is S, $R^6$ and $R^7$ are separate or connected to each other by a single bond, and when $X^a$ is I, one of $R^6$ or $R^7$ is a lone pair of electrons, and Ar is a $C_{5-30}$ aromatic-containing group.

5. The polymer of claim 1, wherein the acid-deprotectable monomer comprises a monomer of formula (III), the base-soluble monomer comprises a monomer of formula (IV), the lactone-containing monomer comprises a monomer of formula (V), and the photoacid-generating monomer comprises a monomer of formula (VI):

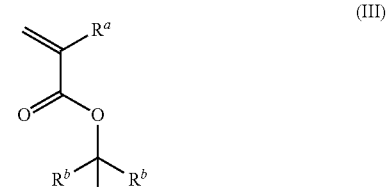

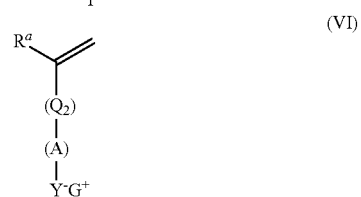

wherein in the formulae (III), (IV), (V), and (VI), each $R^a$ is independently H, F, CN, $C_{1-10}$ alkyl, or $C_{1-10}$ fluoroalkyl, each $R^b$ is independently $C_{1-20}$ alkyl, $C_{3-20}$ cycloalkyl, $C_{6-20}$ aryl, or $C_{7-20}$ aralkyl, and each $R^b$ is separate or at least one $R^b$ is bonded to another $R^b$ to form a cyclic structure, $Q_1$ is an ester-containing or non-ester containing $C_{1-20}$ alkyl, $C_{3-20}$ cycloalkyl, $C_{6-20}$ aryl, or $C_{7-20}$ aralkyl, W is a base-reactive group comprising —C(=O)—OH; —C(CF$_3$)$_2$OH; —NH—SO$_2$—$Y^1$ where $Y^1$ is F or $C_{1-4}$ perfluoroalkyl; an aromatic —OH; or an adduct of any of the foregoing with a vinyl ether, a is an integer of 1 to 3, T is a monocyclic, polycyclic, or fused polycyclic $C_{4-20}$ lactone-containing group, $Q_2$ is ester-containing or non-ester containing and fluorinated or non-fluorinated and is $C_{1-20}$ alkyl, $C_{3-20}$ cycloalkyl, $C_{6-20}$ aryl, or $C_{7-20}$ aralkyl group, A is ester-containing or non ester-containing and fluorinated or non-fluorinated, and is $C_{1-20}$ alkyl, $C_{3-20}$ cycloalkyl, $C_{6-20}$ aryl, or $C_{7-20}$ aralkyl, Y⁻ is an anionic moiety comprising sulfonate, an anion of a sulfonamide, or an anion of a sulfonimide, and G⁺ is a cation of formula (II).

6. The polymer of claim 5, wherein the acid deprotectable monomer of formula (III) comprises:

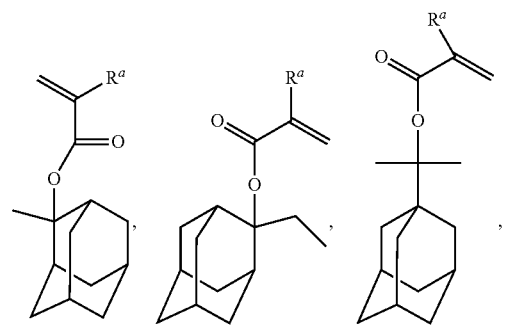

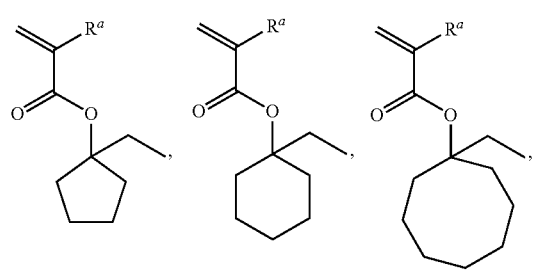

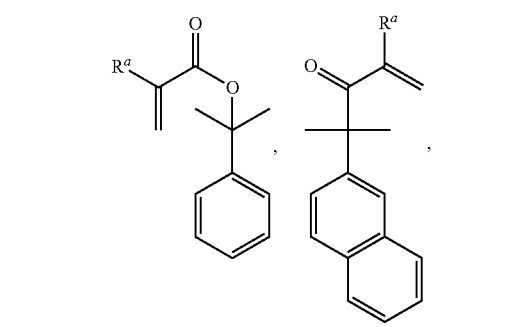

or a combination comprising at least one of the foregoing, wherein $R^a$ is H, F, $C_{1-6}$ alkyl, or $C_{1-6}$ fluoroalkyl; and/or wherein the base-soluble monomer having the formula (IV) comprises:

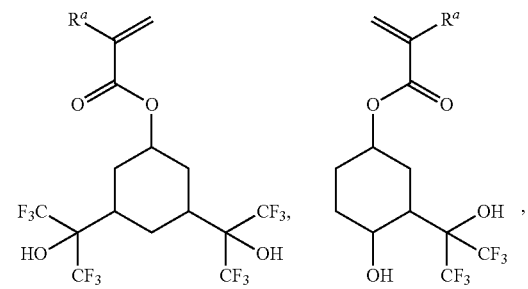

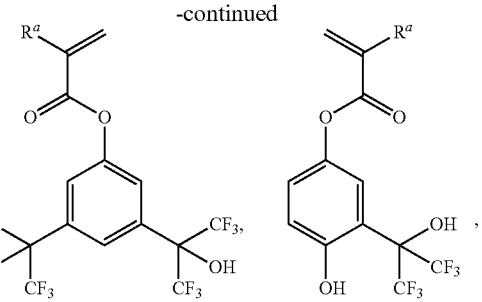

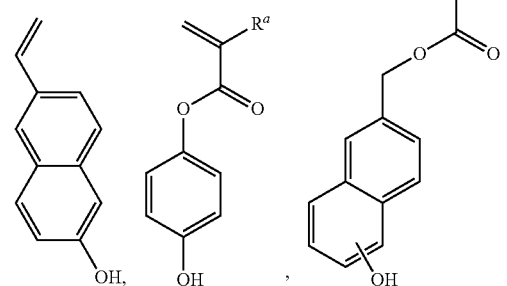

or a combination comprising at least one of the foregoing, wherein $R^a$ is H, F, $C_{1-6}$ alkyl, or $C_{1-6}$ fluoroalkyl; and/or wherein the lactone-containing monomer of the formula (V) comprises:

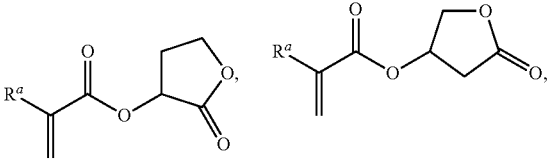

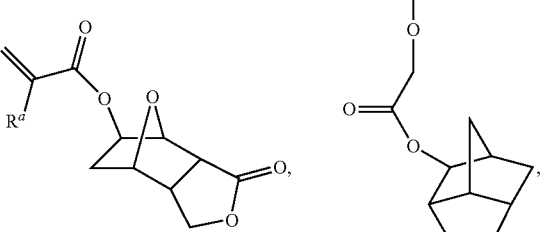

or a combination comprising at least one of the foregoing, wherein $R^a$ is H, F, CN, $C_{1-6}$ alkyl, or $C_{1-6}$ fluoroalkyl.

7. The polymer of claim 5, wherein in formula (VI), A is a —[(C($R^c$)₂)$_x$C(=O)O]$_c$—(C($R^d$)₂)$_y$(CF₂)$_z$— group, or an o-, m- or p-substituted —C₆$R^e$₄— group, where each $R^c$, $R^d$, and $R^e$ are each independently H, F, CN, $C_{1-6}$ fluoro alkyl, or $C_{1-6}$ alkyl, c is 0 or 1, x is an integer of 1 to 10, y and z are independently integers of from 0 to 10, and the sum of y+z is at least 1.

8. A photoresist composition comprising the polymer of claim 1.

9. A coated substrate, comprising: (a) a substrate having one or more layers to be patterned on a surface thereof; and (b) a layer of the photoresist composition of claim 8 over the one or more layers to be patterned.

10. A method of forming an electronic device, comprising: (a) applying a layer of the photoresist composition of claim 8 on a substrate; (b) pattern-wise exposing the photoresist composition layer to activating radiation; and (c) developing the exposed photoresist composition layer to provide a resist relief image.

11. The method of claim 10, wherein the radiation is extreme-ultraviolet or e-beam radiation.

* * * * *